United States Patent [19]

MacKay

[11] Patent Number: 5,393,573
[45] Date of Patent: Feb. 28, 1995

[54] METHOD OF INHIBITING TIN WHISKER GROWTH

[75] Inventor: Colin A. MacKay, Austin, Tex.

[73] Assignee: Microelectronics and Computer Technology Corporation, Austin, Tex.

[21] Appl. No.: 730,744

[22] Filed: Jul. 16, 1991

[51] Int. Cl.⁶ .............................................. B05D 3/06
[52] U.S. Cl. ................... 427/528; 427/523; 427/531
[58] Field of Search .................. 204/192.31; 427/38, 427/39, 523, 528, 531

[56] References Cited

U.S. PATENT DOCUMENTS

| | | | |
|---|---|---|---|
| 3,663,384 | 5/1972 | Lescure | 204/43 |
| 3,915,757 | 10/1975 | Engel | 204/192.31 X |
| 3,956,123 | 5/1976 | Rosenberg et al. | 204/54 R |
| 3,966,564 | 6/1976 | Hyner et al. | 204/43 S |
| 4,016,305 | 4/1977 | Wakabayashi et al. | 204/192.31 X |
| 4,029,556 | 6/1977 | Monaco et al. | 204/40 |
| 4,049,508 | 9/1977 | Morrissey | 204/43 S |
| 4,093,466 | 6/1978 | Davis | 106/1.22 |
| 4,162,205 | 7/1979 | Wilson et al. | 204/43 S |
| 4,168,223 | 9/1979 | Igarashi et al. | 204/43 S |
| 4,194,913 | 3/1980 | Davis | 106/1.22 |
| 4,207,148 | 6/1980 | Hsu | 204/43 S |
| 4,252,618 | 2/1981 | Grenda | 204/43 S |
| 4,263,106 | 4/1981 | Kohl | 204/43 S |
| 4,331,518 | 5/1982 | Wilson | 204/43 S |
| 4,347,107 | 8/1982 | Teichmann et al. | 204/44 |
| 4,459,185 | 7/1984 | Obata et al. | 204/43 S |
| 4,511,403 | 4/1985 | Orio et al. | 106/1.22 |
| 4,530,875 | 7/1985 | Denomoto et al. | 428/283 |
| 4,645,115 | 2/1987 | Kamigaito et al. | 204/192.31 X |
| 4,683,149 | 7/1987 | Suzuki et al. | 204/192.31 X |
| 4,715,894 | 12/1987 | Holtzman et al. | 106/1.22 |
| 4,749,626 | 6/1988 | Kadija et al. | 428/647 |

FOREIGN PATENT DOCUMENTS

| | | |
|---|---|---|
| 54-12894 | 7/1979 | Japan . |
| 55-11389 | 4/1980 | Japan . |
| 56-6599 | 3/1981 | Japan . |
| 1167138 | 10/1969 | United Kingdom . |
| 18774 | 6/1965 | U.S.S.R. . |

OTHER PUBLICATIONS

"Repressing the Growing of Tin Whiskers," *Plating*, Jan. 1966, pp. 96–99.

"Tin–Lead Electrodeposits: The Effect of Impurities in the Solution," *Plating*, Apr. 1970, pp. 369–371.

"Spontaneous Growth of Tin Whiskers on Tin Coatings: 20 Years of Observation," *Transactions of the Institute of Metal Finishings*, vol. 52, 1974, pp. 95–102.

*Primary Examiner*—Nam Nguyen
*Attorney, Agent, or Firm*—Fulbright & Jaworski

[57] ABSTRACT

An improved method for inhibiting tin whisker growth involving the implantation in a tin coating of an ion or ions selected from the group Pb, Bi, Sb, Tl, Cu, Ag, Au, Cd, Mo, Cr, W, Ar, He, Ne and Kr.

10 Claims, No Drawings

METHOD OF INHIBITING TIN WHISKER GROWTH

BACKGROUND OF THE INVENTION

The present invention relates to an improved method of inhibiting tin whisker growth. More particularly, the present invention relates to a method of implanting ions into tin coatings for the purpose of inhibiting tin whisker growth.

Coating components with tin or tin-containing material have become increasingly important in fabricating electronic circuits, electronic devices, electrical connectors, and other items. Such coatings, for example, protect components from corrosion, provide a chemically stable surface for soldering, and provide good surface electrical contact.

Tin coatings may be applied to metallic substrates by a variety of plating solutions and methods. For example, a tin coating may be formed by immersing an item to be coated in a tin-containing solution. Also, a tin coating may be formed by electrodepositing in solution a tin layer on a substrate. The following references illustrate a variety of methods for applying tin coatings to metallic substrates: U.S. Pat. No. 3,966,564 to Hyner et al.; U.S. Pat. No. 4,049,508 to Morrissey; Japanese Patent Publication No. 55-113894; Russian Patent No. 187,746; the article "Tin-Lead Electrodeposits: The Effect of Impurities in the Solution," by G. W. Cavanaugh et al., Plating, April 1970, pp. 369–371; U.S. Pat. No. 3,663,384 to Lescure; U.S. Pat. No. 3,956,123 to Rosenberg et al.; U.S. Pat. No. 4,029,556 to Monaco et al.; U.S. Pat. No. 4,162,205 to Wilson et al.; U.S. Pat. No. 4,168,223 to Igarashi; U.S. Pat. No. 4,207,148 to Hsu; U.S. Pat. No. 4,347,107 to Teichmann et al.; Japanese Patent Publication No. 54-128947; and Japanese Patent Publication No. 56-65993.

Regardless of the tin-coating method used, it is desirable to form a tin surface that is smooth, that has minimum porosity, that has a relatively constant thickness, that resists interdiffusion with the metal substrate, and that is not brittle. High-purity tin is often used to overcome those problems. However, from high-purity tin can grow spontaneously tin filaments called "tin whiskers". Tin whiskers are undesirable because they, for example, can cause electrical shorts and electrical bridges.

The mechanics of the formation of tin whiskers are not clearly understood. Tin whiskers may form from high-purity tin as soon as one day from the date of application of the tin coating, or they may form several years later. There is speculation in the literature that tin whiskers grow from stress concentration sites. There is also speculation that temperature and humidity affect tin whisker growth. The article "Simultaneous Growth of Whiskers on Tin Coatings: 20 Years of Observation" by S. C. Britton, Transactions of the Institute of Metal Finishing, Vol. 52, 1974, pp. 95–102, discusses the tin whisker problem and offers recommendations for reducing the risk of tin whisker formation.

One approach to lessen the tin whisker problem has been to specify short storage times for tin-coated materials. However, that approach does not fully address or necessarily avoid the problem. Another approach has been to mildly strengthen the tin matrix to prevent the extrusion of tin whiskers. Such strengthening may be accomplished by facilitating diffusion of the metal substrate into the tin, forming, for example, a copper-tin intermetallic compound. The cost of strengthening the tin matrix is a decrease in performance in the final product.

Other approaches to lessen the growth of tin whiskers generally involve the addition of whisker-inhibiting chemicals to the coating solution. U.S. Pat. No. 4,093,466 and No. 4,194,913, both to Davis, disclose the incorporation of both a sulphur containing complexing agent, such as thiourea, and a soluble plumbous salt into a tin immersion bath solution. U.S. Pat. No. 4,263,106 to Kohl discloses electroplating with tin from an acidic aqueous solution containing tin, lead (or alloys of tin and lead), and one or more additions of a class of organic compounds including lactones, lactams, cyclic sulfate esters, cyclic imides, and cyclic oxazolinones. U.S. Pat. No. 4,331,518 to Wilson discloses electroplating with tin from an acid aqueous solution containing tin and a chelate salt comprising an acid bismuth sulfate gluconate. U.S. Pat. No. 4,749,626 to Kadija et al. discloses the incorporation in a tin immersion bath solution of metal salts, including palladium, silver, nickel, iron, cadmium, platinum, gold, indium, ruthenium, and cobalt. U.K. Patent No. 1,167,138 suggests that tin whisker growth may be prevented by reducing the amount of hydrogen absorbed or occluded in the structure of the plating metal. S. M. Arnold, "Repressing the Growing of Tin Whiskers," Plating, January, 1966, pp. 96–99, discloses that a number of metals reduce tin whiskers when present in the tin coating.

The above approaches to the reduction of tin whisker growth have been present for some time. However, they are all limited, in that, each discloses tin plating by only immersion or electroplating.

SUMMARY OF THE INVENTION

It is, therefore, an object of the present invention to provide an alternative method for preventing the development and growth of tin whiskers.

A further object of the present invention is to produce a surface metal alloy by ion implantation having reduced diffusion characteristics to inhibit the mechanisms promoting tin whisker growth.

Thus, in accordance with the present invention, there is provided a method for preventing the development and growth of tin whiskers, comprising the steps of providing a material having a tin coating, and implanting into the surface of said tin coating an ion selected from the group consisting of Pb, Bi, Sb, Tl, Cu, Ag, Au, Cd, Mo, Cr, W, Ar, He, Ne, and Kr. The ion more preferably is Pb, Bi, Sb, Tl, Cu, Ag, Au, Cd, Mo or Ar. Most preferably, Sb, Ar or Mo is the ion of choice.

According to this method, the dosage rate of the ion is greater than about $1 \times 10^{12}$ ions/cm$^2$ and preferably between about $1 \times 10^{13} - 1 \times 10^{16}$ ions/cm$^2$. Furthermore, the implanting step is performed at an acceleration potential of between about 25 kV and 100 kV, preferably between about 50 kV and 100 kV.

In more preferred embodiments, the present invention involves a method for preventing the development and growth of tin whiskers, comprising the steps of providing a material having a tin coating, and implanting into said tin coating from about (1) $1 \times 10^{14} - 1 \times 10^{16}$ ions/cm$^2$ of an antimony ion, (2) $1 \times 10^{14} - 1 \times 10^{16}$ ions/cm$^2$ of an argon ion, or (3) $1 \times 10^{13}$ ions/cm$^2$ of molybdenum ion.

These and other objects, features and advantages of the present invention will be further described in the detailed description of preferred embodiments which follows.

DETAILED DESCRIPTION OF PREFERRED EMBODIMENTS

A variety of ions may be selected for implantation. Of particular interest are those ions that are effective in inhibiting whisker growth by conventional alloying, and those ions that are effective in inhibiting the alpha to beta phase transformation of white to gray tin. The former group of ions comprise Pb, Sb, Bi and Cu. The latter group includes Bi, Sb, Tl, Cu, Ag, Au and Cd. The inventor also has found that the Group 4b metals, i.e., Mo, Cr and W, and the noble gases, He, Ne, Ar and Kr are effective.

The ions are introduced to the underlying tin coating in flux densities greater than about $1 \times 10^{12}$ ions/cm$^2$. The flux densities most preferably range from about $1 \times 10^{13} - 1 \times 10^{16}$ ions/cm$^2$.

The implantation generally is performed by introducing the ions to the tin at acceleration potentials of at least about 25 kV, and preferably between about 50–100 kV. The lower the acceleration voltage, the higher the surface concentration of the element. Accordingly, for the highest concentration in the thinnest alloy zone, high doses at low energies should be used.

The implantation is performed by introducing a tin-coated base material in an implanter device. Such devices are generally known. For instance, a common implanter and one of particular utility to the present invention is an Eaton NV 6200 or Varian XP 300. The selected ions are loaded into the implanter and both the current and voltage are selected. The tin is exposed to the ion for the necessary time to achieve a given density given the selected current. The method of operation is described and explained in such references as the "Ion Implantation Equipment and Technology Series," Proceedings of the International Ion Implantation Conferees by the American Vacuum Society; and *Physics of Semi-Conductor Devices* by Sze, 2nd Ed., published by Wiley Interscience. Ion sources in gaseous form are dissociated in an applied field that accelerates the ions towards the target at a controlled velocity depending upon voltage. Solid sources can also be used with Knudsen Cells.

The following non-limiting examples are provided to further illustrate the present invention. These examples are meant to illustrate and not to limit the invention, the scope of which is defined solely by the appended claims.

EXAMPLES

Tape automated bonding (TAB) samples having tin coatings on copper foil were selected for testing. The samples were placed in an Eaton NV 6200 implanter apparatus. The testing was performed utilizing antimony, argon and molybdenum as test ions. Antimony was selected to test the applicability in the present invention of those elements which are effective in inhibiting the alpha to beta phase transformation of white to gray tin. Argon and molybdenum, while not members of the above set, were considered to have potential applicability. The following table presents the results of the testing:

TABLE 1

| Dose | Voltage | Age Time/DAYS | Whiskers-Y/N |
|---|---|---|---|
| Control | | | |
| 0 | — | 1 | Y |
| 0 | — | 3 | Y |
| Antimony | | | |
| $1 \times 10^{14}$ | 100 | 1 | N |
| $1 \times 10^{14}$ | 100 | 3 | Y |
| $1 \times 10^{15}$ | 100 | 97 | N |
| $5 \times 10^{15}$ | 100 | 97 | N |
| $1 \times 10^{16}$ | 100 | 97 | N |
| $1 \times 10^{16}$ | 50 | 97 | N |
| Argon | | | |
| $1 \times 10^{14}$ | 100 | 1 | Y |
| $1 \times 10^{15}$ | 100 | 97 | N |
| $1 \times 10^{16}$ | 100 | 97 | N |
| Molybdenum | | | |
| $1 \times 10^{13}$ | 100 | 1 | N |
| $1 \times 10^{13}$ | 100 | 14 | Y |

The samples were aged at 50° C., the condition found to most accelerate whisker formation for this system, and were examined and photographed at seven-day intervals up to about 100 days using a scanning electron microscope. The same area of each sample was examined each time to assure correct recordation of whisker growth, if any.

As the above results indicate, ion implantation according to the criteria of the present invention successfully inhibits tin whisker growth. The results reflect that low dose levels of the select implantation ions at higher acceleration potentials, i.e., about 100 kV, were marginally successful in inhibiting whisker growth; however, the results improved at these higher potentials with higher dose levels. Some surface modification was in evidence. For example, argon produced a surface with the appearance of a eutectic structure. Antimony, at higher dose levels, produced some nodular structure areas. In contrast, molybdenum showed very little surface modification.

The present invention, therefore, is well-adopted to carry out the objects and attain the ends and advantages mentioned, as well as others inherent therein. While presently preferred embodiments of the invention have been described for the purpose of disclosure, the numerous changes in materials and conditions may be made without departing from the spirit of the present invention and the scope of the appended claims.

What is claimed is:

1. A method for preventing the development and growth of tin whiskers, comprising the steps of:
   providing an electrical component having a tin coating; and
   inhibiting whisker growth on the tin coating by implanting into the surface of said tin coating an ion selected from the group consisting of Pb, Bi, Sb, Tl, Cu, Ag, Au, Cd, Mo, Cr, W, Ar, He, Ne, and Kr.

2. A method as claimed in claim 1, wherein said ion is selected from the group consisting of Pb, Bi, Sb, Tl, Cu, Ag, Au, Cd, Mo, and Ar.

3. A method as claimed in claim 2, wherein said ion is selected from the group consisting of Sb, Ar, and Mo.

4. A method as claimed in claim 1, wherein the dosage rate of said ion is greater than about $1 \times 10^{12}$ ions/cm$^2$.

5. A method as claimed in claim 4, wherein the dosage rate ranges from about $1 \times 10^{13} - 1 \times 10^{16}$ ions/cm$^2$.

6. A method as claimed in claim 1, wherein said implanting step is performed at an acceleration potential of between about 25 kV and 100 kV.

7. A method as claimed in claim 6, wherein said acceleration potential is between about 50 kV and 100 kV.

8. A method for preventing the development and growth of tin whiskers on an electrical component, comprising the steps of:
   providing a tin coating on the electrical component; and
   inhibiting whisker growth on the tin coating by implanting into said tin coating from about $1 \times 10^{14} - 1 \times 10^{16}$ ions/cm$^2$ of an antimony ion.

9. A method for preventing the development and growth of tin whiskers on an electrical component, comprising the steps of:
   providing a tin coating on the electrical component; and
   inhibiting whisker growth on the tin coating by implanting into said tin coating from about $1 \times 10^{14} - 1 \times 10^{16}$ ions/cm$^2$ of an argon ion.

10. A method for preventing the development and growth of tin whiskers on an electrical component, comprising the steps of:
    providing a tin coating on the electrical component; and
    inhibiting whisker growth on the tin coating by implanting into said tin coating at least $1 \times 10^{18}$ ions/cm$^2$ of molybdenum ion.

* * * * *